United States Patent [19]

Takegawa et al.

[11] Patent Number: 5,379,454
[45] Date of Patent: Jan. 3, 1995

[54] STATION SELECTION DEVICE IN TUNER FOR AUTOMATIC SELECTION ACCORDING TO INPUT INFORMATION

[75] Inventors: Tomohiro Takegawa; Akira Tasaki; Hiroshi Koinuma, all of Tokyo, Japan

[73] Assignee: Pioneer Electronic Corporation, Tokyo, Japan

[21] Appl. No.: 841,768

[22] Filed: Mar. 2, 1992

Related U.S. Application Data

[63] Continuation of Ser. No. 639,441, Jan. 10, 1991, abandoned, which is a continuation of Ser. No. 310,568, Feb. 15, 1989, Pat. No. 5,023,938.

[30] Foreign Application Priority Data

Jun. 3, 1988 [JP] Japan .................................. 63-135670
Jun. 3, 1988 [JP] Japan .................................. 63-135671

[51] Int. Cl.$^6$ .......................................... H04B 17/02
[52] U.S. Cl. .......................... 455/158.5; 455/186.2
[58] Field of Search ................. 455/158, 160–161, 455/165–166, 168, 179, 180, 182–186; 358/191.1, 192.1, 193.1, 194.1; 379/354, 355

[56] References Cited

U.S. PATENT DOCUMENTS

| | | | |
|---|---|---|---|
| 4,122,395 | 10/1978 | Schotz et al. | 455/186 |
| 4,392,246 | 7/1983 | Niioka et al. | 455/186 |
| 4,521,914 | 6/1985 | Petrovic | 455/186 |
| 4,706,121 | 11/1987 | Young | 455/186 |
| 4,709,387 | 11/1987 | Masuda | 379/355 |
| 4,914,517 | 4/1990 | Duffield | 455/186 |
| 5,023,938 | 6/1991 | Takegawa | 455/183 |
| 5,045,947 | 9/1991 | Beery | 358/192.1 |

FOREIGN PATENT DOCUMENTS 0012115 1/1986 Japan .................................. 455/158

*Primary Examiner*—Reinhard J. Eisenzopf
*Assistant Examiner*—Andrew Faile
*Attorney, Agent, or Firm*—Sughrue, Mion, Zinn, Macpeak & Seas

[57] ABSTRACT

A tuner having a programmable frequency divider which selects a broadcast station in accordance with a frequency division number, and a broadcast station selecting device. The selecting device includes an input device for inputting information representing a broadcast station; a memory means for storing information representing a plurality of broadcast stations and for storing frequency division numbers respectively corresponding to the stored information; and a control circuit for reading from the memory he stored frequency division number corresponding to the inputted information by the input device, and for supplying the read frequency division number to the programmable frequency divider so that the programmable frequency divider will select a broadcast station in accordance with the supplied frequency division number.

3 Claims, 3 Drawing Sheets

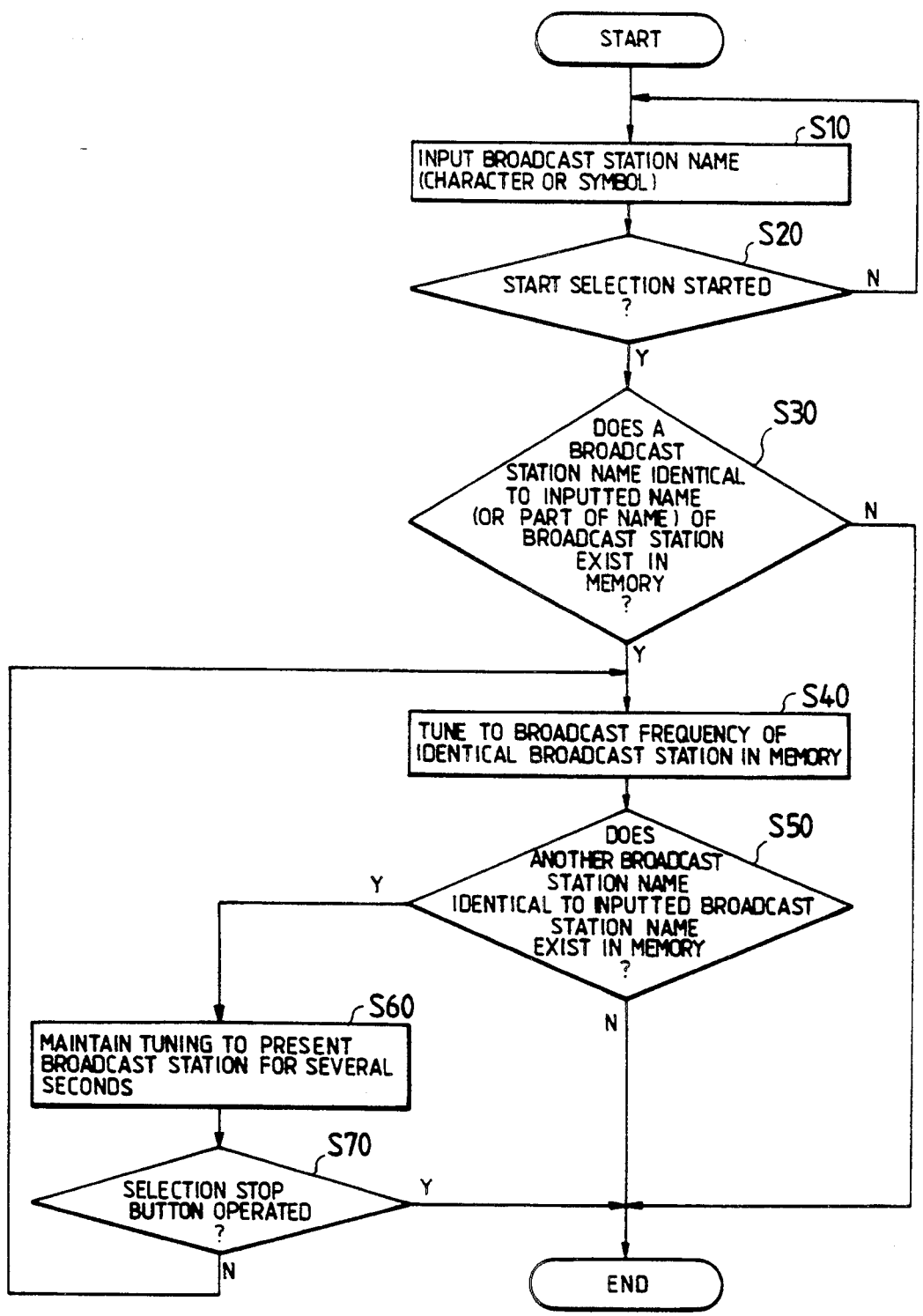

STATION SELECTION DEVICE IN TUNER FOR AUTOMATIC SELECTION ACCORDING TO INPUT INFORMATION

This is a continuation of application Ser. No. 07/639,441 filed Jan. 10, 1991 abandoned which is a continuation of application Ser. No. 07/310,568, filed Feb. 15, 1989 now U.S. Pat. No. 5,023,938.

FIELD OF THE INVENTION

The present invention relates to a tuner, and more particularly to tuner having a station selecting device which can automatically select a desired broadcast frequency in accordance with inputted information representing the desired broadcast station.

BACKGROUND OF THE INVENTION

A tuner which operates according to a so-called "direct tuning system" is available in which a desired broadcast station can be selected when an operator inputs, through an operating button, the frequency of the desired broadcast station.

However, this type of conventional tuner is disadvantageous in that the desired station can only be selected when the operator has remembered the exact broadcast frequency. For example, consider the situation where this type of tuner is installed in an automobile, and the operator of the automobile wants to listen to a local FM broadcast station over the automobile's stereo radio receiver, but the operator only vaguely remembers the frequency of the local broadcast station (e.g., the operator can only remember the two high-order digits of the broadcast frequency). In this situation, it will take a relatively long period of time (during which time the operator must adjust the inputted broadcast frequency), before the operator is able to select or input the frequency corresponding to the desired broadcast station.

A device is also available in the art in which the manufacturer or operator of the device has previously stored the names of broadcast stations in memory so that when anyone of the broadcast stations is selected with preset button means, its name is displayed on a display unit.

However, this type of device also suffers from shortcomings. More particularly, with this type of device, broadcast station names are not used to select a broadcast station. Therefore, in the case where the operator has forgotten which preset buttons have been assigned to which broadcast stations, or in the case where the operator driving an automobile desires to listen to, for example, an FM broadcast station over the automobile's stereo radio receiver, and knows the name of the desired FM broadcast station but not the broadcast frequency, the operator is not able to select the desired broadcast station.

SUMMARY OF THE INVENTION

Accordingly, an object of the invention is to eliminate the above-described shortcomings associated with the prior art devices.

More specifically, an object of the invention is to provide a tuner with a station selecting device which can quickly select a desired broadcast frequency even if the operator only vaguely remembers the frequency of the desired broadcast station, and therefore only inputs an approximate frequency of the desired broadcast station.

This object is accomplished by the present invention in accordance with a first embodiment. The first embodiment of the invention provides a tuner having a programmable frequency divider for selecting a broadcast station in accordance with a frequency division number, and a station selecting device. The station selecting device includes means for inputting a frequency number representing a desired broadcast station, detector means for detecting a tuned signal which is generated when the programmable frequency divider is supplied with a frequency division number corresponding to a broadcasting station, and memory means for storing frequency numbers representing a plurality of broadcast stations and for storing a plurality of frequency division numbers respectively corresponding to the stored frequency numbers. The selecting device further includes control means for reading from the memory means the frequency division number corresponding to the inputted frequency number by said input means, and for supplying the read frequency division number to the programmable frequency divider so that the programmable frequency divider selects a broadcast station in accordance with the supplied frequency division number. When the inputted frequency number does not cause the detector means to detect the tuned signal, the control means repeatedly adjusts the inputted frequency until the detector means detects the tuned signal, thereby indicating that one of the adjusted frequency numbers corresponds to a broadcasting station.

Another object of the invention is provide a tuner having a selection circuit which can quickly select a desired broadcast station in response to an inputted name of the desired broadcast station. The present invention accomplishes this object in accordance with a second embodiment of the invention.

The second embodiment of the invention includes a tuner having a programmable frequency divider which selects a broadcast station in accordance with a frequency division number, and a station selecting device comprising input means for inputting information representing a broadcast station, memory means for storing information representing a plurality of broadcast stations and for storing frequency division numbers respectively corresponding to the stored information, and control means for reading from the memory means the stored frequency division number corresponding to the inputted information by the input means and for supplying the read frequency division number to the programmable frequency divider so that the programmable frequency divider will select a broadcast station in accordance with the supplied frequency division number.

BRIEF DESCRIPTION OF THE DRAWINGS

FIG. 3 is a flow chart for explaining the operation of the control circuit of FIG. 1 according to the second embodiment of the invention.

DESCRIPTION OF THE PREFERRED EMBODIMENTS

Figure 1:
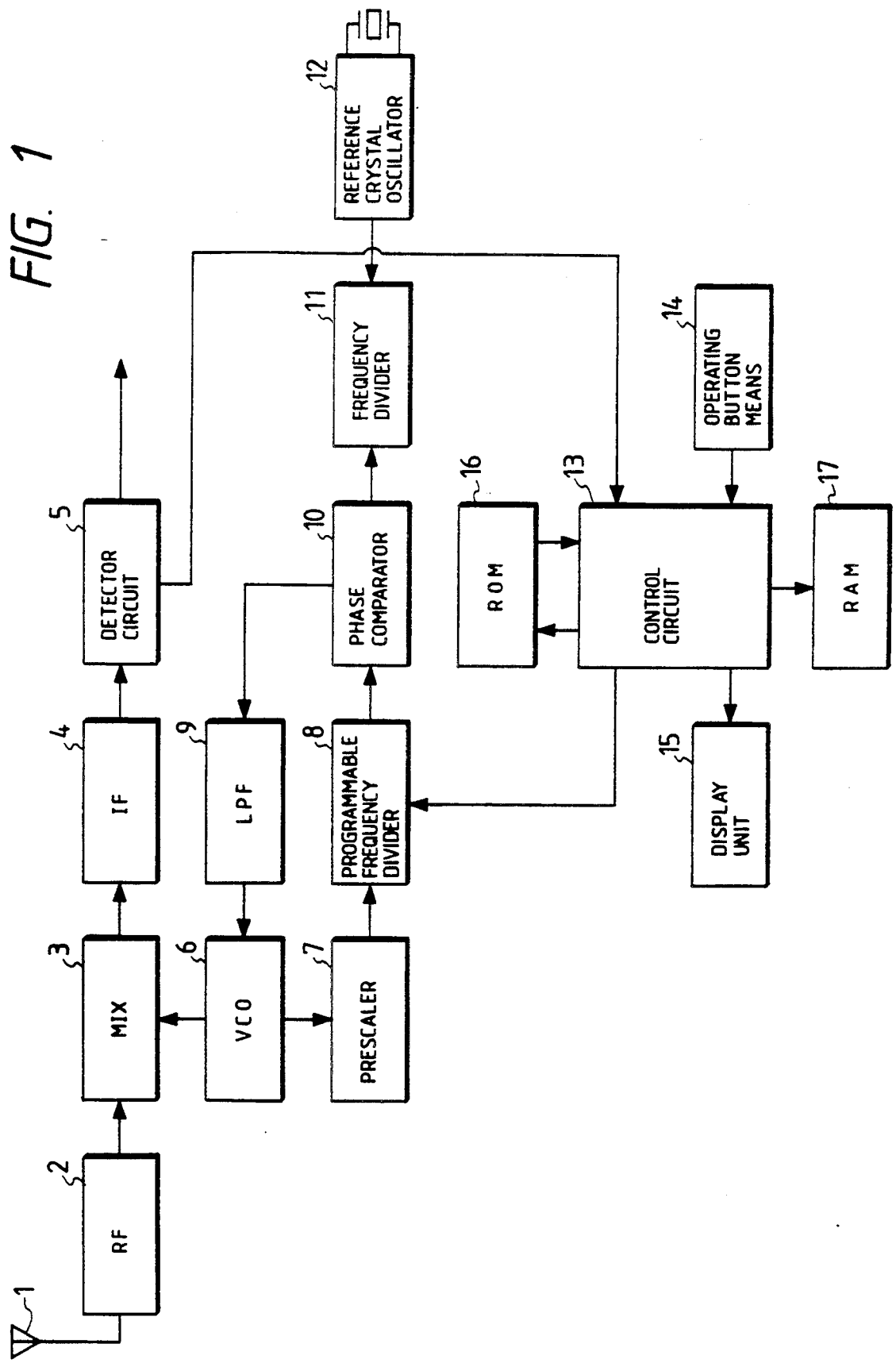
FIG. 1 is a block diagram showing a selection device in a tuner according to the present invention.

A first and a second preferred embodiment of the invention will be described with reference to FIG. 1 which shows a station selection device applied to a digital synthesizer tuner. In FIG. 1, reference numeral 1 designates an antenna; 2, an RF amplifier; 3, a mixer; 4, an IF amplifier; 5, a detector circuit; 6, a VCO (voltage-controlled oscillator) serving as a local oscillator; 7, a prescaler for reducing the output of the VCO to one-quarter ($\frac{1}{4}$); 8, a programmable frequency divider; 9, a low-pass filter; 10, a phase comparator; 11, a frequency divider; and 12, a reference crystal oscillator. The above-described circuit elements 1 through 12 are all conventional.

When it is required to receive, for instance, an 80 MHz FM broadcast signal, the VCO 6 must oscillate 80−10.7 MHz. If the frequency division number N applied to the programmable frequency divider 8 is 693 (N=693) (usually a variable frequency divider is used), and the frequency division number of the prescaler 7 is four (4), then 25 KHz (=69.3 MHz/(4×693)) is applied to the phase comparator 10; and, if the oscillation frequency of the reference crystal oscillator 12 is 100 KHz, and the frequency division number of the frequency divider 11 is four (4), then a frequency component of 25 KHz (=100 KHz/4) is applied to one input terminal of the phase comparator 10, and a PLL (phase-locked loop) including the VCO 6 is formed. Therefore, control is made so that the frequency $f_1$ of the VCO 6 is 69.3 MHz ($f_1$=69.3 MHz). As is apparent from the above description, when it is required to vary the signal receiving frequency, the frequency division number of the programmable frequency divider 8 is first changed (for FM bands, N=654 to 792), and then the signal receiving frequency is determined in correspondence to the frequency division number thus changed.

In the case of AM broadcast signals, since the channel space is 9 KHz, the VCO 6 is similarly controlled with the reference frequency of 9 KHz.

Further in FIG. 1, reference numeral 13 designates a control circuit (the operation of which will be described in detail later in connection with the two embodiments of the invention). The control circuit 13 receives the output signal of the detector circuit 5 and the output signal of an operating button means 14, and applies a signal to a display unit 15 and a frequency division number to the programmable frequency divider 8. The operating button 14 is, for example, a numerical keyboard having ten (10) keys for inputting a frequency number, or a character keyboard for inputting alphabetic characters. The display unit 15 operates to display the frequency number or characters inputted by manipulating the operating button 14. In the case of a numerical keyboard, the display unit 15 displays the frequency inputted by the operating button means, the frequency of the present station selection, and, when a station corresponding to the inputted frequency is stored, the name of the station. In the case of a character input keyboard for inputting the name of a desired station, the keyboard consists of alphabet keys to input the desired station, or up and down buttons to input the characters. For example, the keyboard may be used to input a broadcast station name such as "NHK" which is displayed on the display unit 15.

Further in FIG. 1, reference numeral 16 designates a ROM (read-only memory) which serves in the first embodiment as an off-set memory for adjusting the inputted frequency by gradually incrementing and decrementing the inputted frequency to frequencies within the frequency band. The memory 16 also serves in the first embodiment to store broadcast station frequencies, and frequency division numbers corresponding to the broadcast station frequencies. In the second embodiment, the memory 16 serves to store broadcast station names and frequency division numbers corresponding to the broadcast station names. FIG. 1 also shows a memory 17, such as a RAM (random access memory) which is used when a selected broadcast station is stored by means of a preset button or the like. In the case of the second embodiment, the name and the frequency division number of a selected broadcast station can be stored in the RAM 17.

Figure 2:
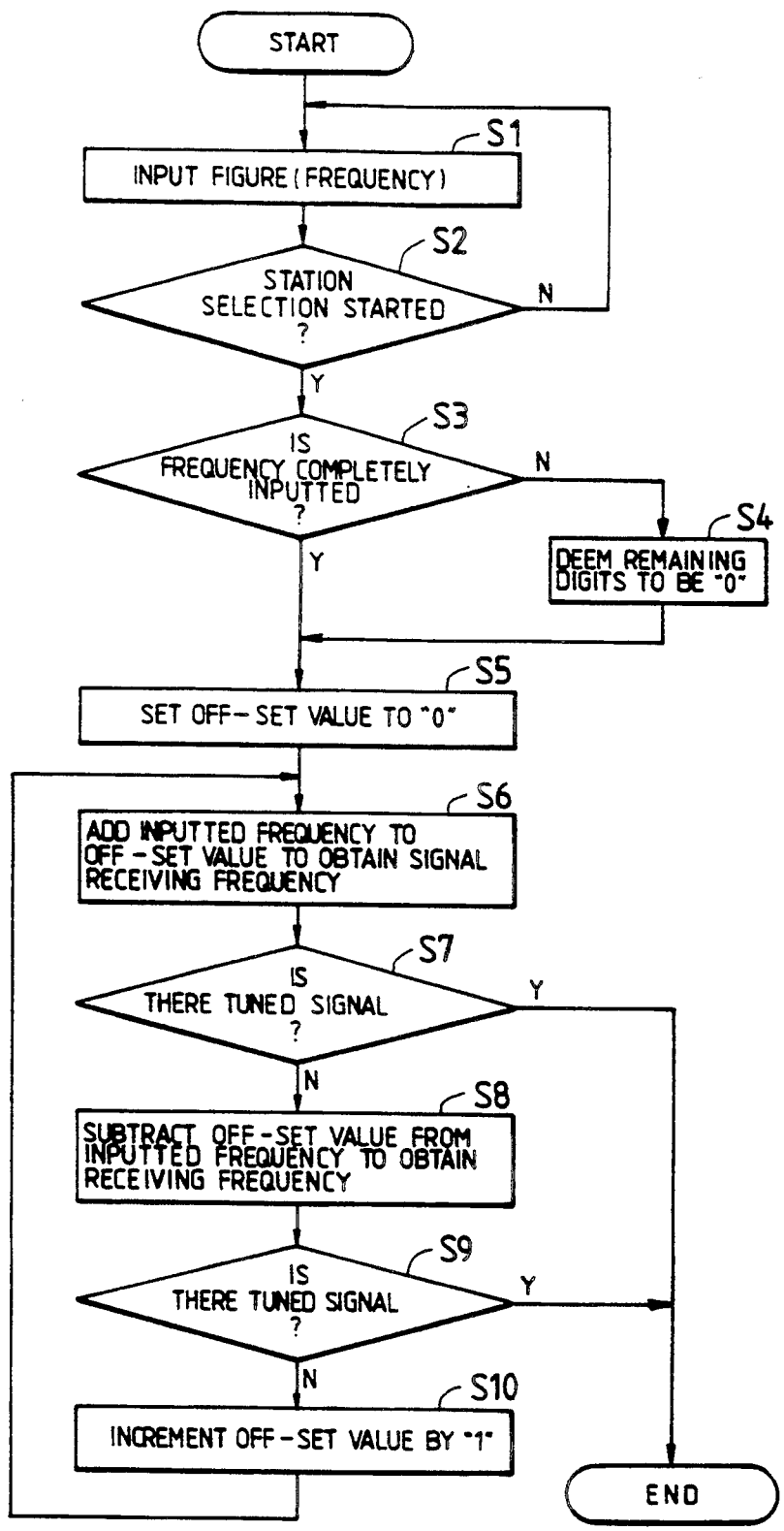
FIG. 2 is a flow chart for explaining the operation of the control circuit of FIG. 1 according to the first embodiment of the invention.

The operation of the control circuit 13 shown in FIG. 1 will now be described in accordance with the first embodiment of the invention with reference to the flow chart of FIG. 2.

Assume for example that a person is driving an automobile while listening to a program broadcasted by an FM broadcast station, and that the radio waves of the FM broadcast station become too weak for the person to listen to the station. Assume further that the person now wants to listen to a program broadcasted by a local broadcast station located in the area where the person is presently driving the automobile, but the person does not exactly remember the broadcast frequency of the station. In this case, the person would manipulate the operating button means 14 to input a part of the frequency which he has memorized, for instance, the two high-order digits thereof (Step S1). Then, a station selection start button provided as part of the operating button means 14 is operated (Step S2) for starting a station selection operation. After the start button is operated, the control circuit 13 determines whether or not all of the digits of the inputted frequency have been completely inputted (Step S3). When it is determined that all of the digits of the frequency have been completely inputted (e.g., three digits of "82.5 MHz" have all been inputted), then Step S5 is performed. On the other hand, when it is determined in Step S3 that all of the digits have not been inputted (e.g., "82 MHz" has been inputted), it is assumed that the remaining digits are all "0" (Step S4), and then Step S5 is performed.

In Step S5, an off-set value is initially set to zero (0), and the off-set value is added to the inputted frequency in Step S6. That is, in the case where all the digits (82.5 MHz) have been inputted, the frequency 82.5 MHz is outputted as it is; and in the case where only a part of the digits (82 MHz) of the frequency has been inputted, the frequency 82 MHz is also outputted as it is. Upon determination of the frequency (the offset value being "0" in Step 6), the control circuit 13 reads out of the memory 16 the frequency division number corresponding to the frequency determined in Step 6, and applies it to the programmable frequency divider 8. If there is a broadcasting station corresponding to the frequency division number applied to the divider 8, then the detector circuit 5 outputs a tuned signal. The control circuit 13 then determines whether or not the tuned signal is available (Step S7). When a broadcasting station tuned thereto is found in this manner, the present value of the frequency receiving signal is maintained, and the station selecting operation is ended. Accordingly, in the case where the exact broadcast frequency of a broadcast station is known and all the digits thereof have been inputted, and the corresponding broadcast station is broadcasting, then the station selecting operation will be ended.

On the other hand, if the detector circuit 5 outputs no tuned signal in Step 7, then Steps S8 and S9 are followed where operations are carried out in a similar manner as in Steps S6 and S7. However, in Step S8, the offset value is subtracted from the inputted frequency value instead of being added as in Step S6. If in Step S9 a tuned signal is not detected by detector circuit 15, then the value of the offset value is incremented by "1" (Step S10). Thereafter, Step S6 is then performed again. In performing Step S6 for a second or more time, the incremented offset value from Step S10 is added to the inputted frequency, to obtain a new signal receiving frequency. For example, in the case described above where only two digits, 82 MHz, were inputted, the new signal receiving frequency would be set to 82.1 MHz, and the frequency division number corresponding to this signal receiving frequency would be applied to the programmable frequency divider 8. Under this condition, it is determined whether or not a tuned signal is outputted by the detector circuit 5 (Step S7). When the tuned signal is outputted, the operation is ended as in the above-described case. When the tuned signal is not outputted, the incremented offset value is subtracted (Step S8) from the inputted frequency (82 MHz) to obtain a new signal receiving frequency equal to 81.9 MHz, and the frequency division number corresponding to this new signal receiving frequency is applied to the programmable frequency divider 8. When the tuned signal is outputted (Step S9), the operation is ended; and when not, the above-described operation of incrementing the offset value (Step S10) is performed. The above sequence of operations (Steps S6–S10) will be repeatedly performed until a tuned signal is outputted by the detector circuit 5.

In the above-described embodiment, the inputted signal receiving frequency is gradually increased or decreased. However, in practice, the signal receiving frequency should be changed according to the channel plan in each country. For instance, in the case of FM broadcasts, it may be changed at frequency intervals of 25 KHz in USA, 100 KHz in Japan, 200 KHz in Europe, and in the case of AM broadcast, it may be changed at frequency intervals of 9 KHz in Japan and Europe, and 10 KHz in USA.

In practice, where the addition and subtraction of the offset value are carried out alternately as in Steps S6 and S8, it will take a relatively long period of time to select a desired broadcast station, because of the tuned signal detecting time in the tuner or the lock-up time of the PLL. Therefore, the signal receiving frequency may be shifted in an addition mode repeatedly, and then in a subtraction mode repeatedly in such a manner that, for instance, in the case of 100 KHz as in Japan, ±0 KHz, +100 KHz, +200 KHz, +300 KHz, −100 KHz, −200 KHz and −300 KHz; and +400 KHz, +500 KHz, +600 KHz, −400 KHz, −500 KHz and −600KHz are added to the inputted frequency.

As was described above in connection with this first embodiment of the invention, even when an operator only vaguely remembers the broadcast frequency of a desired broadcast station, the receiver can be tuned to the broadcast frequency by merely inputting the remembered part of the broadcast frequency with the operating button means; that is, the inputted frequency is automatically offset to select the desired broadcast station. Therefore, for instance, when the person in an automobile wants to listen to a radio program of a certain radio broadcast station from an automobile stereo radio receiver, but the person does not exactly know the broadcast frequency thereof, the radio station can still be readily and quickly selected.

The operation of the circuit shown in FIG. 1 will now be described in connection with the second embodiment of the invention with reference to the flow chart of FIG. 3.

Assume, as above, that a person is driving an automobile while listening to a program broadcasted by an FM broadcast station, and that the radio waves of the broadcast become too weak for the person to hear, and therefore the person wants to listen to a program broadcasted by a local broadcast station located in the area where the person is presently driving the automobile. Further, assume that the operator has remembered the name of the local broadcast station in the area but not the broadcast frequency thereof, and that the person wants to tune to this local station. In this case, the person manipulates the operating button means 14 to input at least part of the broadcast station name (Step S10), and then operates a station selection start button forming a part of the operating button means 14 (Step S20) to start a station selection operation. In response to operating the start button, the control circuit 13 determines whether or not a broadcast station whose name is identical to the broadcast station name expressed by the inputted characters representing the station name is stored in the memories 16 and 17 (Step S30). When the inputted characters representing the broadcast station name are stored, the control circuit outputs the stored frequency division number corresponding to the broadcast station name. The frequency division number thus outputted is applied to the programmable frequency divider 8. Therefore, as was described with reference to FIG. 1, when the radio receiver is tuned to the broadcast frequency of the broadcast station, the tuned signal is outputted by the detector circuit 5, and the radio receiver is maintained tuned thereto (Step S40).

Under this condition, it is determined whether or not any other stored broadcast station name is equal to the inputted station name (Step S50). If such a broadcast name is not stored, then the radio receiver is maintained tuned to the broadcast frequency of the broadcast station thus selected, and the selection operation is ended. However, if another broadcast station name which is equal to the inputted station name is stored, then the radio receiver is maintained tuned to the present broadcast station for a predetermined amount of time, for example, several seconds (Step S60). Under this condition, the control circuit 13 detects whether or not a station selection stop button forming a part of the operating button means 14 has been operated (Step S70). When the stop button is operated (i.e., is depressed) within the above indicated predetermined amount of time, then the selection operation is ended with the radio receiver maintained tuned to the frequency of the present broadcast station. If the stop button is not depressed within the predetermined amount of time, then Step S40 is again performed so that the radio receiver is tuned to the broadcast station of another station whose name is stored in the memory and which name coincides with the inputted name.

When a broadcast station name stored in memory 16 or 17 coincides with the inputted characters, but the radio waves of this station are weak, then it will be impossible to tune the radio receiver to this station. Therefore, in this case, after searching for the broadcast station in Step S30, Step 40 may be immediately performed again so that a search may be conducted for another broadcast station whose name coincides with the next part of the inputted characters.

Although a broadcast station name whose name coincides with all of the inputted characters may be stored in the memory, the radio waves transmitted from this radio station may be too weak to receive, and therefore it would be impossible to tune the radio receiver to this station. Therefore, in this case, design may be made so that the display unit will display this fact (i.e., that the selected broadcast station is available, but its radio waves are too weak for reception).

When, in Step S30, the broadcast station name inputted through the operating button means 14 is not available in the memories 16 and 17, then the station selecting operation is ended.

The above-described tuning conditions, being stored in the memory 17, can be stored by means of a preset button (not shown).

As is apparent from the above description of the second embodiment of the invention, even if the operator does not know the broadcast frequency of a desired broadcast station or the names of preset broadcast stations, a desired station can still be selected. That is, when part or all of the name of a desired broadcast station, inputted through the operation button means, coincides with part or all of a broadcast station name stored in the memory, the selection of the desired station is readily achieved. Accordingly, in the case where an operator driving an automobile wants to tune, for instance, the car stereo radio receiver to a desired broadcast frequency of a broadcast station, but only vaguely remembers the name of the desired broadcast station, the broadcast station can still be readily selected.

What is claimed is:

1. A tuner having a programmable frequency divider which selects a broadcast station in accordance with a frequency division number, the tuner comprising:

input means for inputting information representing at least one character of a broadcast station name, said input means including means operable for successively inputting a plurality of characters of the broadcast station name;

memory means for storing character information representing a plurality of broadcast station names and for storing frequency division numbers respectively corresponding to the stored information representing the plurality of broadcast station names; and control means, coupled to said input means, for reading from said memory means a stored frequency division number in accordance with the information inputted by said input means and for supplying the read frequency division number to the programmable frequency divider so that the programmable frequency divider will select a broadcast station in accordance with the supplied frequency division number, wherein said control means includes stop means for stopping said control means from supplying a stored frequency division number to the programmable frequency divider, and wherein when said memory means stores a plurality of broadcast station names corresponding to the information inputted by said input means, said control means successively reads the stored frequency division number corresponding to the inputted information and successively supplies the read frequency division number to the programmable frequency divider unless said stop means is activated.

2. The tuner defined in claim 1, wherein said control circuit does not supply the programmable frequency divider with a successive stored frequency division number until a predetermined amount of time after the programmable frequency divider has selected a broadcast station.

3. The tuner defined in claim 1, wherein said tuner is a radio tuner.

* * * * *